United States Patent [19]

Kuwata

[11] Patent Number: 5,532,505
[45] Date of Patent: Jul. 2, 1996

[54] FIELD EFFECT TRANSISTOR INCLUDING A CAP WITH A DOPED LAYER FORMED THEREIN

[75] Inventor: Nobuhiro Kuwata, Yokohama, Japan

[73] Assignee: Sumitomo Electric Industries, Ltd., Japan

[21] Appl. No.: 150,349

[22] Filed: Nov. 10, 1993

Related U.S. Application Data

[63] Continuation of Ser. No. 810,406, Dec. 23, 1991, abandoned.

[30] Foreign Application Priority Data

Dec. 27, 1990 [JP] Japan ..................... 2-407762

[51] Int. Cl.⁶ ............................................... H01L 29/812
[52] U.S. Cl. ..................... 257/269; 257/280; 257/287
[58] Field of Search ........................... 357/4, 16, 22 A, 357/22 MD, 22 I, 88; 257/12, 20, 24, 27, 192, 194, 195, 280, 287, 269, 282, 285

[56] References Cited

U.S. PATENT DOCUMENTS

| | | | |
|---|---|---|---|
| 4,163,984 | 8/1979 | Purcel | 357/22 |
| 4,673,959 | 6/1987 | Shiraki et al. | 357/16 |
| 4,814,838 | 3/1989 | Kuroda et al. | 357/22 A |
| 4,882,609 | 11/1989 | Schubert et al. | 257/657 |
| 5,151,758 | 9/1992 | Smith | 257/287 |

FOREIGN PATENT DOCUMENTS

| | | | |
|---|---|---|---|
| 0177779 | 8/1986 | Japan | 357/22 |
| 0260861 | 10/1989 | Japan | 357/22 |

OTHER PUBLICATIONS

H. Sakaki, Velocity–Modulation Transistor–A New Field Effect Transistor Concept, Japanese Journal of Applied Physics, vol. 1, No. 6, Jun. 1982, pp. L381–L383.
"GaAs MESFET's Fabricated By New Self–Alignment Technology," *Extended Abstracts of the 19th Conference on Solid State Devices and Materials, Tokyo, 1987*, by Eiji Yanokura et al. pp. 263–266.
"Long Gate Effect Due To Gate–Drain Surface Depletion Layer In GaAs MESFETs," by Hiroshi Mizuta et al., 1986, 8 pages.
Patent Abstracts of Japan vol. 010091 (E–394) 9 Apr. 1986, Tatsuya et al., Man. of Semiconductor Device.

*Primary Examiner*—Peter Toby Brown
*Attorney, Agent, or Firm*—Beveridge, DeGrandi, Weilacher & Young

[57] ABSTRACT

This invention aims at providing an high output FET having a planar type-gate structure suitable for integration, and a structure that suppresses long gate effect. A heavily doped thin channel layer 13 is formed on a semiconductor substrate 11, and a cap layer including a doped layer 15 is formed on the channel layer 13. A thickness and a dopant concentration of the doped layer 15 are so set that the doped layer 15 per se is depleted by a surface depletion region resulting from an interface level of the semiconductor substrate surface, and the surface depletion region does not widen to the channel layer 13. Consequently no long gate effect takes place on the side where a gate bias is lower.

32 Claims, 4 Drawing Sheets

Prior Art

FIELD EFFECT TRANSISTOR INCLUDING A CAP WITH A DOPED LAYER FORMED THEREIN

This application is a continuation of application Ser. No. 07/810,406, filed Dec. 23, 1991, now abandoned, which application is entirely incorporated herein by reference.

BACKGROUND OF THE INVENTION

1. Field of the Invention

This invention relates to a field effect transistor (FET), specifically to a structure of a field effect transistor which is suitable for integration, and has high outputs and gains.

2. Related Background Art

Recently accompanying the rapid development of information network systems, the needs for direct broadcast satellite communication systems as well is on increase, and the frequency band is becoming higher. High frequency FETs, especially GaAs metal-semiconductor FETs (MESFETs) are practiced as transistors which can make a break through the characteristic limit of the conventionally used Si bipolar transistors. Recently for the miniaturization, lower prices and higher performance of the systems, the integration of the first stage amplification circuits of a downconverter that converts a high frequency signal to a low frequency signal is advanced and the circuits are formed as microwave monolithic integrated circuits (MMIC's).

To achieve higher output and higher efficiency of the GaAs MESFET, it is important to reduce a resistance between the source electrode and the gate electrode, i.e., the source resistance (Rs) to thereby increase the transconductance ($g_m$), and, at the same time, to increase the drain voltage resistance between the gate electrode and the drain electrode. In view of this, as described in Japanese Patent Laid-open Publication No. 177779/1986, the usual high-output MESFETs use the structure of FIG. 1 for decreasing the source resistance Rs. That is, a gate structure which is called recess structure is used. In the recess structure, a recess 3 of a given depth is provided between the source electrode 1 and the drain electrode 2, and the gate electrode 4 is formed on the bottom surface of the recess 3. Furthermore, for increasing the drain voltage resistance, the gate electrode 4 is offset nearer to the source electrode 1 so that distance between the gate electrode 4 and the drain electrode 2 becomes wide.

But in such device structure, for example, in an n-channel MESFET, a phenomenon called long gate effect occurs where a gate bias is lower, i.e., where the gate voltage has a negative value, and its absolute value is smaller. This long gate effect is a phenomenon that an effective gate length increases due to a surface depletion region on the side of the drain electrode 2. This phenomenon is reported in good detail in The Institute of Electronics Information and Communication Engineers (AED86-142, 1986). It is known that the transconductance $g_m$ lowers due to this long gate effect. As means for improving the long gate effect, the MESFET of the structure of FIG. 2 was disclosed in Japanese Patent Laid-Open Publication No. 260861/1989. That is, a recess 8 is formed in an operational layer 7 between a source electrode 5 and a drain electrode 6, a gate electrode 9 is formed on the bottom surface of the recess 8, and the recess 8 has the stepped sidewall nearer to the drain electrode 6. This two-step sidewall prevents the long gate effect.

On the other hand, there is a high-frequency MESFET having a gate electrode region of a planar structure without such recess structure. In this MESFET, the ion implantation of dopant ions is performed by utilizing self-alignment using the gate electrode as a mask in order to reduce the source resistance of the operational layer. The integration of this MESFET with the gate electrode region of such planar structure is reported in GaAs IC Symposium Technical Digest (1987), pages 45 to 48 and pages 49 to 52. In addition, there is a MESFET having a gate electrode region of such planar structure which was developed by the applicant of the present application, and this MESFET is described in IEEE MTT-S International Microwave Symposium Digest, 1990, pages 1081 to 1084. In this MESFET, an epitaxial wafer of a pulse-doped structure having a thin channel layer of a higher carrier density, and a cap layer of a lower carrier density formed on the channel layer is used. The integration of this planar-structure FET having such pulse-doped structure is disclosed in GaAs IC Symposium Technical Digest, 1990, pages 237 to 240.

But the respective conventional FETs described above have the following technical problems. The MESFET with the recess structure of FIG. 2 has solved the occurrence of long gate effect intrinsic to the recess-structure FET of FIG. 1, but because of the recess-structure intrinsically formed in the gate electrode region, the homogeneity and reproductivity of the manufactured FETs are not good. This results from poor controllability of the recess etching in forming recesses 3, 8, which causes deviations of an etched depth. In integrating especially such MESFETs on semiconductor substrates as high-output integrated circuit devices, the yield becomes low, the productivity becomes low.

On the other hand, the planar-structure MESFET without such recess structure in the gate electrode region is free from the above-described problems involved in homogeneity and reproductivity resulting from the recess etching, but has the same problem as the recess-structure FET of FIG. 1. That is, for higher output and higher drain voltage resistance of the FET, as described above, the gate electrode is offset apart from the $n^+$ ion added layer nearer to the drain electrode. But in this structure, as described above, long gate effect adversely occurs where a gate bias is lower, and the transconductance $g_m$ adversely lowers. Furthermore, the MESFET having such planar-structure gate electrode region has not been able to find effective preventive means owned by the recess-structure MESFET, i.e., the effective means that the sidewall of the recess has two steps as in FIG. 2.

SUMMARY OF THE INVENTION

An object of this invention is to provide a high output FET which has solved the above-described problems, and has a planar gate structure suitable for integration and a structure for suppressing long gate effect.

Further object of the present invention to provide a field effect transistor comprising a heavily doped thin channel layer formed on a substrate through a non-doped buffer layer, a cap layer formed on the channel layer, a gate electrode formed on the cap layer in Schottky contact therewith and a source electrode and a drain electrode formed on both sides of the gate electrode in ohmic contact with the cap layer, in the cap layer there being formed a doped layer having a dopant of the same conduction as the channel layer added to.

In an FET according to the present invention, the extension of a surface depletion region from a substrate surface to deeper within the FET is prevented by the doped layer so that the surface depletion layer does not affect the channel layer and as the result only the depletion region under the gate electrode affects the channel layer. Accordingly long-gate effect is not caused. Additionally, in this time, the doped layer itself is depleted by the surface depletion region so that the insulation between the gate and the drain is not degraded. Further as the FET has a planar structure, the productive yield of the FET is higher than that of the FET having a recess-structure.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
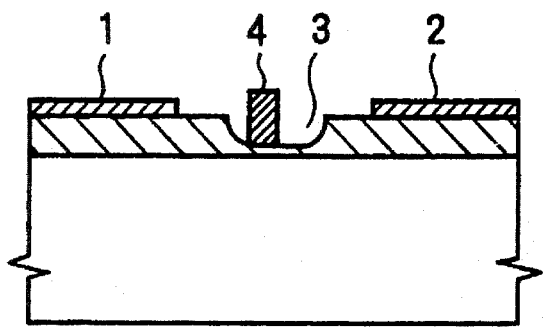
FIG. 1 is a sectional view of one example of the conventional MESFETs.
Figure 2:
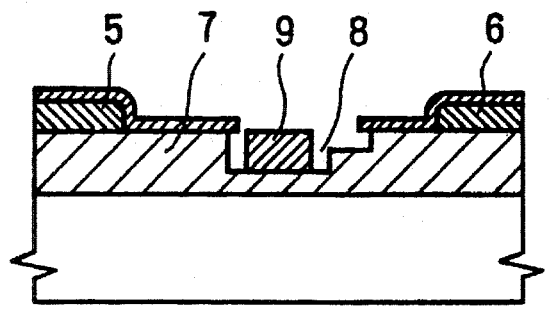
FIG. 2 is a sectional view of another example of the conventional MESFETs.
Figure 3:
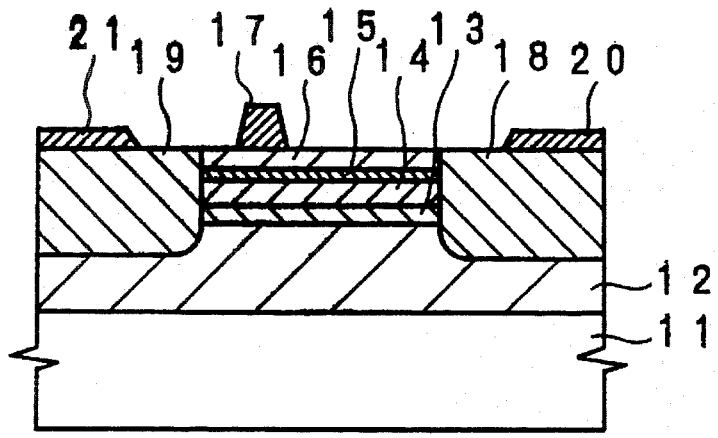
FIG. 3 is a sectional view of the structure of MESFET according to one embodiment of this invention.
Figure 4A:
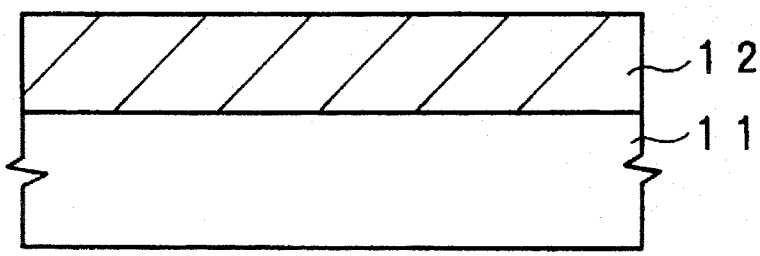
FIGS. 4A to 4D are sectional views of the MESFET of FIG. 3.
Figure 4B:
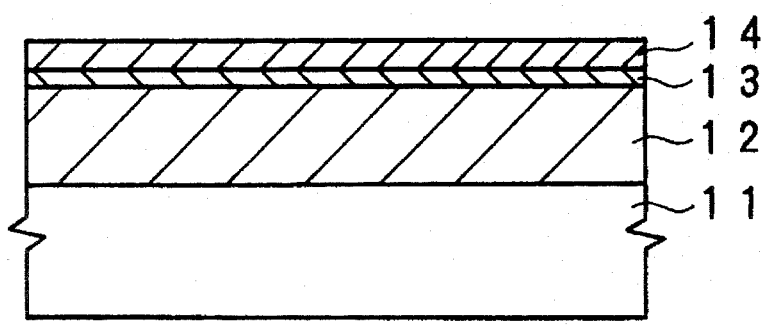
Figure 4C:
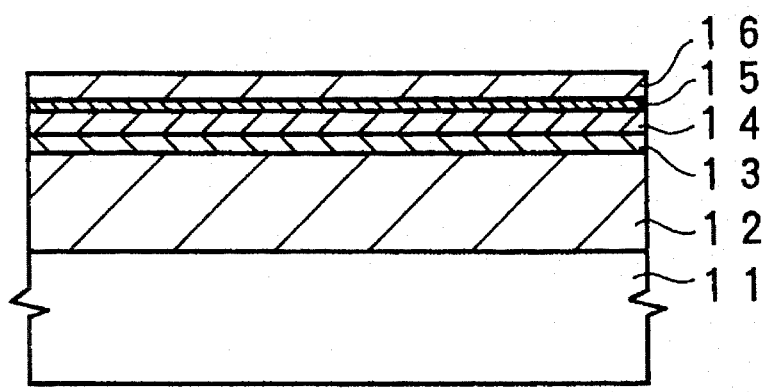
Figure 4D:
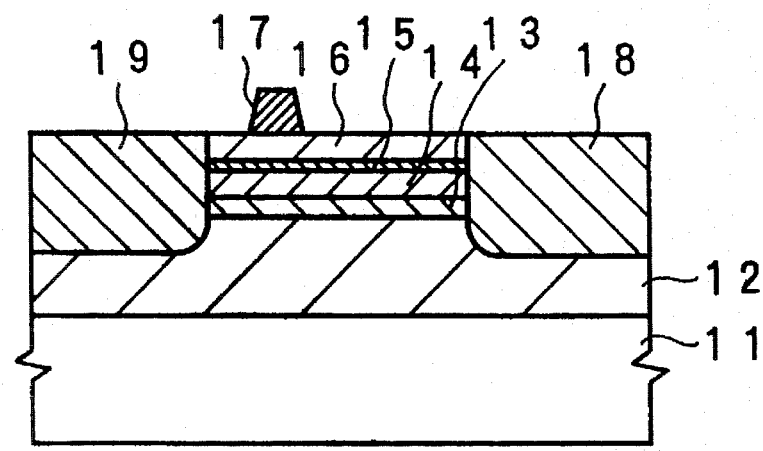

FIG. 3 is a sectional view of the structure of the MESFET according to one embodiment of this invention. The fabrication process of this MESFET is shown in the sectional views of the respective fabrication steps of FIGS. 4A to 4D. To clarify the structure of this MESFET, its fabrication steps will be explained firstly, and then the operation of this MESFET will be explained. First, an un-doped GaAs buffer layer 12 is formed on a semi-insulating GaAs semiconductor substrate 11 (see FIG. 4A). This buffer layer 12 is formed by a crystal growing method, such as MBE (molecular beam epitaxy), OMVPE (organic metal vapor phase epitaxy), and to improve the carrier sealing of a channel layer 13 which will be explained later, a feed ratio between a V group material and a III group material is controlled to form p-conduction. The carrier concentration of this GaAs buffer layer 12 is set at, e.g., $2.5 \times 10^{15}$ cm$^{-3}$.

Then, an Si-doped GaAs channel layer 13 is formed on the buffer layer 12 at a carrier density as high as $4 \times 10^{18}$ cm$^{-3}$ and in a thickness as thin as 200 Å. On this channel layer 13 subsequently is formed an n-conduction un-doped GaAs layer 14 at a concentration below $1 \times 10^{15}$ cm$^{-3}$ and in a thickness of 150 Å (see FIG. 4B). These layers 13, 14 are formed by a crystal growing method, such as MBE, OMVPE, or others.

Next, on the un-doped layer 14 is formed a doped layer 15 which is an Si-doped GaAs layer at a $4 \times 10^{18}$ cm$^{-3}$ carrier density and in a 50 Å thickness. Then on this doped layer 15 is formed an n-conduction un-doped GaAS layer 16 at a carrier density below $1 \times 10^{15}$ cm$^{-3}$ and in a 200 Å-thickness (see FIG. 4C). These layers 15, 16 are also formed by the above-described crystal growing method. The un-doped layer 14, the doped layer 15 and the un-doped layer 16 constitute a cap layer. In the above-stated thickness and dopant concentration of the doped layer 15 of the cap layer, a surface depletion region caused by a surface state depletes the doped layer 15 itself and as the result the surface depletion region does not extend to the channel layer 13.

Subsequently a gate electrode 17 is formed on an epitaxial wafer of such structure by vaporization, lithography, etching or other methods. Then an oxide or the like is formed on the sidewall of the gate electrode 17, and with this oxide or the like as a mask Si ions are selectively implanted in the substrate surface. This ion implantation forms n$^+$-Si ion-implanted region 18, 19 (see FIG. 4D). In this case, the ion-implanted layer 18, which is on the drain side, is formed further from the gate electrode 17.

Finally a drain electrode 20 and a source electrode 21 are formed in ohmic contact with the respective ion-implanted region 18, 19 by the same vaporization, lithography or other methods. When these electrodes are prepared, a MESFET of the structure of FIG. 3 is completed.

In the MESFET of this structure according to this embodiment, the gate electrode 17 is formed on the flat cap layer, and a planar structure MESFET is formed. Consequently the disadvantage of the FET having a recess structure at the gate electrode region, i.e., the disadvantage of lower fabrication yields resulting from poor homogeneity and reproduction due to the recess etching can be eliminated.

Next the operation of the MESFET according to this embodiment will be explained below with reference to FIGS. 5A to 5B in comparison with the conventional MESFETs.

Figure 5A:
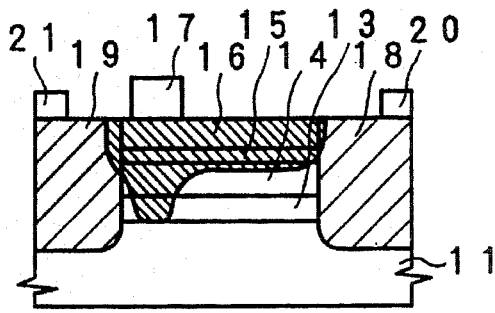
FIGS. 5A and 5B are sectional views of the FET according to the embodiment and of the conventional FETs both with the channels completely shut by depletion regions.
Figure 6A:
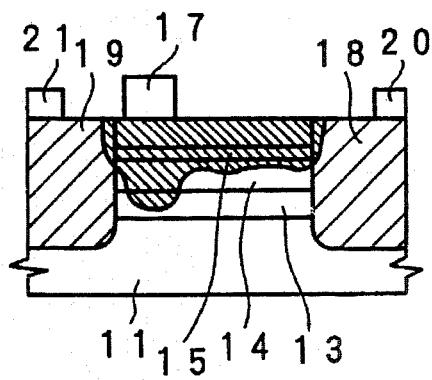
FIGS. 6A and 6B are sectional views of the FET according to the embodiment and the conventional FETs with their depletion layers in their states where a gate bias is lower.
Figure 7A:
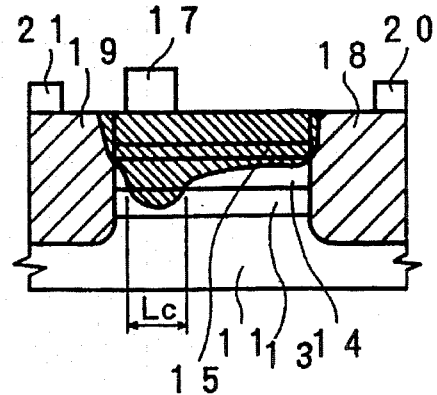
FIGS. 7A and 7B are sectional views of the FET according to the embodiment and the conventional FETs with their depletion regions in their states where the gate bias is further lower.

FIGS. 5A, 6A and 7A show the MESFET according to this embodiment, and the parts common with those of FIG. 3 have common reference numerals.

Figure 5B:
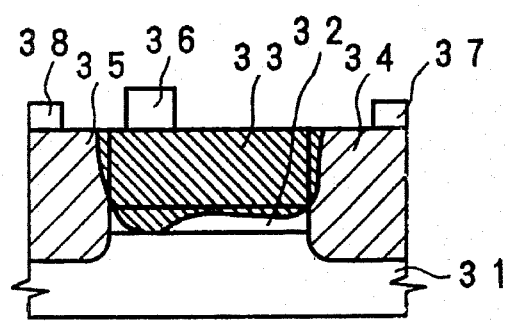
Figure 6B:
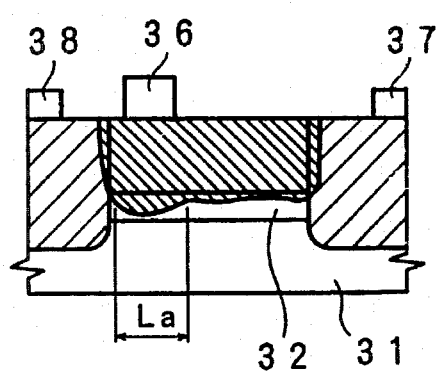
Figure 7B:
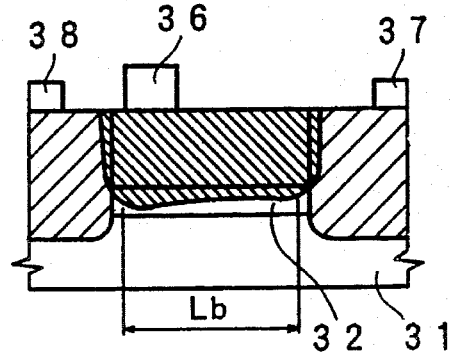

FIGS. 5B, 6B and 7B respectively show MESFETs having a planar-structure formed by the conventional technology.

In this conventional MESFET, the same channel layer 32 as the channel layer 13 in this embodiment is formed on the GaAs semiconductor substrate 31. A lightly doped cap layer 33 is formed on this channel layer 32. The same ion-implanted region 34, 35 as the ion implanted region 18, 19 in this embodiment are formed on both sides of the cap layer 33. A gate electrode 36, a drain electrode 37 and a source electrode 38 are formed at the same positions relative to one another as those of this embodiment.

FIGS. 5A and 5B show the states of these MESFETs where the same negative gate voltage $V_g$ is applied to their respective gate electrodes 17, 36 for their respective source electrode 21, 38 and the channel are completely closed by their respective depletion region directly below their respective gates.

That is, in the FET of the embodiment shown in FIG. 5A, a depletion layer under the gate electrode 17 which is designated by oblique lines, completely closes the channel layer and also in the conventional FET of FIG. 5B. The depletion region under the gate electrode 36, which is designated by oblique lines completely closes the channel layer 32. Surface depletion region resulting from surface interface level between the gate electrodes 17, 86 of the MESFETs and the n$^+$-Si ion-implanted region 18, 34 on the side of the drain electrodes, and are integral with the depletion region directly below the gate electrodes.

FIGS. 6A and 6B show the states of the depletion region of the MESFETs in their respective states of FIGS. 5A and 5B in the case that the gate bias voltage $V_g$ lowered, i.e., the gate voltage $V_g$ gradually decreased to 0 voltage. The respective depletion region directly below the gates become shallower as negative charges accumulated in the gate electrode 17, 36 decrease, and the channels of the respective current channel layers 13, 32 begin to open. In this state, when a suitable voltage is applied to the applied voltage begins to flow between the respective drain and sources.

FIGS. 7A and 7B show the states of the depletion region of the MESFETs when the gate voltage $V_g$ in the states of FIG. 6A and 6B are further decreased. When an absolute value of the gate voltage $V_g$ gradually decreases down to one value, in the conventional MESFET of FIG. 7B, a depth of the depletion region directly below the gate electrode 36, and a depth of the surface depletion region on the side of the drain electrode 37 extending to the channel layer 32 become substantially equal to each other. Resultantly a short effective gate length La in FIG. 6B becomes a long effective gate length $L_b$ in FIG. 7B, and long gate effect takes place. Consequently due to this long gate effect the transconductance $g_m$ of the conventional MESFET decreases, adversely deteriorating its high frequency characteristic.

In contrast to this, in the MESFET according to this embodiment of FIG. 7A, the growth of the surface depletion region deeper from the substrate surface is prohibited by the doped layer 15. Consequently the channel layer 13 on the side of the drain electrode 20 is free from the influence of the surface depletion region, but is influenced by the depletion region directly below the gate electrode 17. Accordingly an effective gate length $L_c$ does not change, and no long gate effect takes place, as does in the conventional MESFET. Consequently a current channel formed in the channel layer 13 completely opens, and the value of a transconductance $g_m$ is retained high until the current is saturated. As a result, its high frequency characteristic is sustained in good state. At this time, because the doped layer 15 per se is completely depleted by the surface depletion region, the insulation between the gate electrode 17 and the drain electrode 20 does not lower. Consequently in the MESFET according to this embodiment, it is possible to retain the drain voltage resistance high.

Figure 8:
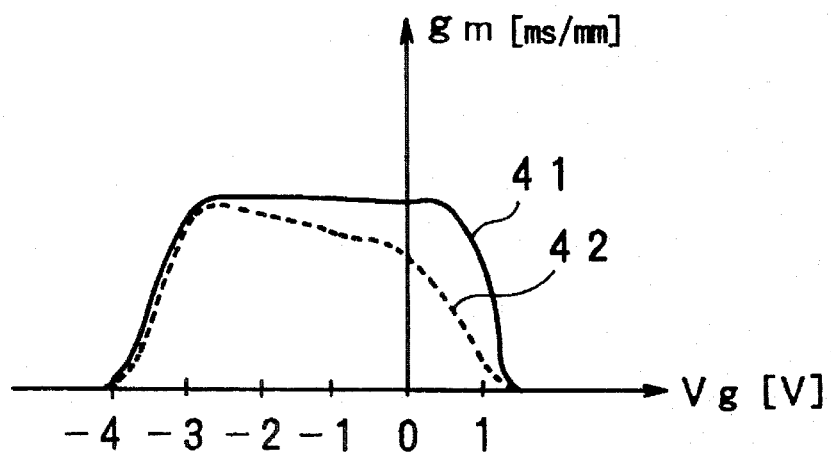
FIG. 8 is a graph of the drain conductance $g_m$ dependence of the FET according to the embodiment and the conventional FETs on the gate voltage $V_g$.

FIG. 8 schematically shows the gate voltage dependence characteristic of the transconductance $g_m$ in the case that the gate bias is changed as above. In FIG. 8 the gate voltage [V] is taken on the horizontal axis, and the transconductance $g_m$ [ms/mm] is taken on the vertical axis. The characteristic curve 41 depicted by the solid line indicates a characteristic of the MESFET according to this embodiment, and the characteristic curve 42 depicted by the dot line show characteristics of the conventional MESFET. As seen from FIG. 8, in the conventional MESFET the value of the transconductance $g_m$ does not lower but retained high at a certain value.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:
   a semi-insulating, compound semiconductor substrate layer;
   an un-doped buffer layer formed on the substrate layer and made of a first compound semiconductor;
   a thin channel layer made of a second compound semiconductor and formed on the buffer layer, the channel layer being heavily doped with a dopant;
   a cap layer formed on the heavily doped thin channel layer, the cap layer having
      a lower layer made of the second compound semiconductor which is substantially lattice-matched with the channel layer and which has the same conductivity type as the channel layer, and
   a doped layer made of the second compound semiconductor, the doped layer being formed by doping with a dopant having a conductivity type which is the same as the dopant in the channel layer;
   a source and a drain electrode, each formed on the cap layer with ohmic contact therebetween; and
   a gate electrode formed between the source and drain electrodes on the cap layer in Schottky contact therewith.

2. A field effect transistor according to claim 1, wherein dopant ions of the same conductivity type as the channel layer are implanted below the source and the drain electrodes.

3. A field effect transistor according to claim 1, wherein the buffer layer, the channel layer and the cap layer are epitaxially grown layers.

4. A field effect transistor according to claim 1, wherein the doped layer of the cap layer is formed on the lower layer, and the cap layer further includes an upper layer on the doped layer, the upper layer having the same conductivity type as the channel layer.

5. A field effect transistor according to claim 4, wherein the upper and the lower layers of the cap layer have a carrier density below $1 \times 10^{15}$ cm$^{-3}$.

6. A field effect transistor according to claim 1, wherein a carrier density of the doped layer is substantially equal to that of the channel layer.

7. A field effect transistor according to claim 1, wherein the un-doped buffer layer has a conductivity type opposite to that of the channel layer, and has a carrier density lower than that of the channel layer.

8. A field effect transistor according to claim 1, wherein a gap between the gate electrode and the drain electrode is wider than a gap between the gate electrode and the source electrode.

9. A field effect transistor according to claim 1, wherein the second compound semiconductor is GaAs.

10. A field effect transistor comprising:
    a semi-insulating, compound semiconductor substrate layer;
    an un-doped buffer layer formed on the substrate layer and made of a first compound semiconductor;
    a thin channel layer made of a second compound semiconductor and formed on the buffer layer, the channel layer being heavily doped with a dopant;
    a cap layer formed on the heavily doped thin channel layer, the cap layer having a lower layer made of the second compound semiconductor and having the same conductivity type as the channel layer, and a doped layer made of the second compound semiconductor, the doped layer being formed by doping with a dopant having a conductivity type which is the same as the dopant in the channel layer, such that the doped layer prevents a surface depletion condition from extending to the channel layer, whereby the channel layer is influenced by a depletion region only at a gate region located below a gate electrode;

a source electrode region and a drain electrode region, the source and drain electrode regions being adapted to provide ohmic contact between the cap layer and source and drain electrodes when formed on the cap layer; and a gate electrode region, the gate electrode region adapted to provide Schottky contact between the cap layer and a gate electrode formed on the cap layer.

11. A field effect transistor according to claim 10, wherein dopant ions of the same conductivity type as the channel layer are implanted to form the source and drain electrode regions.

12. A field effect transistor according to claim 10, wherein the buffer layer, the channel layer and the cap layer are epitaxially grown layers.

13. A field effect transistor according to claim 10, wherein the doped layer of the cap layer is formed on the lower layer, and the cap layer further includes an upper layer formed on the doped layer, the upper layer having the same conductivity type as the channel layer.

14. A field effect transistor according to claim 13, wherein the upper and the lower layers of the cap layer have a carrier density below $1 \times 10^{15}$ cm$^{-3}$.

15. A field effect transistor according to claim 10, wherein a carrier density of the doped layer is substantially equal to that of the channel layer.

16. A field effect transistor according to claim 10, wherein the un-doped buffer layer has a conductivity type opposite to that of the channel layer, and has a carrier density lower than that of the channel layer.

17. A field effect transistor according to claim 10, wherein a gap between the gate electrode region and the drain electrode region is wider than a gap between the gate electrode region and the source electrode region.

18. A field effect transistor according to claim 10, wherein the second compound semiconductor is GaAs.

19. A field effect transistor comprising:

a semi-insulating, compound semiconductor substrate layer;

an un-doped buffer layer formed on the substrate layer and made of a first compound semiconductor;

a thin channel layer made of a second compound semiconductor and formed on the buffer layer, the channel layer being heavily doped with a dopant;

a cap layer formed on the heavily doped thin channel layer, the cap layer having a lower layer made of the second compound semiconductor which is substantially lattice-matched with the channel layer, a doped layer made of the second compound semiconductor, the doped layer being formed on the lower layer by doping with a dopant having a conductivity type which is the same as the dopant in the channel layer and having a thickness and dopant concentration such that the doped layer prevents a surface depletion region from extending into the channel layer, and an upper layer formed on the doped layer, the upper layer and the lower layer of the cap layer having the same conductivity type as the channel layer, and having a carrier density below $1 \times 10^{15}$ cm$^{-3}$;

a source and a drain electrode, each formed on the cap layer with ohmic contact therebetween; and a gate electrode formed between the source and drain electrodes on the cap layer in Schottky contact therewith.

20. A field effect transistor according to claim 19, wherein dopant ions of the same conductivity type as the channel layer are implanted below the source and the drain electrode.

21. A field effect transistor according to claim 19, wherein the buffer layer, the channel layer and the cap layer are epitaxially grown layers.

22. A field effect transistor according to claim 19, wherein a carrier density of the doped layer is substantially equal to that of the channel layer.

23. A field effect transistor according to claim 19, wherein the un-doped buffer layer has a conductivity type opposite to that of the channel layer, and has a carrier density lower than that of the channel layer.

24. A field effect transistor according to claim 19, wherein a gap between the gate electrode and the drain electrode is wider than a gap between the gate electrode and the source electrode.

25. A field effect transistor according to claim 19, wherein the second compound semiconductor is GaAs.

26. A field effect transistor comprising:

a semi-insulating, compound semiconductor substrate layer;

an un-doped buffer layer formed on the substrate layer and made of a first compound semiconductor;

a thin channel layer made of a second compound semiconductor and formed on the buffer layer, the channel layer being heavily doped with a dopant;

a cap layer formed on the heavily doped thin channel layer, the cap layer having a lower layer made of the second compound semiconductor, and a doped layer made of the second compound semiconductor, the doped layer being formed on the lower layer by doping with a dopant having a conductivity type which is the same as the dopant in the channel layer and having a thickness and dopant concentration such that the doped layer prevents a surface depletion condition from extending to the channel layer, whereby the channel layer is influenced by a depletion region only at a gate region located below a gate electrode, and an upper layer formed on the doped layer, the upper layer and the lower layer of the cap layer having the same conductivity type as the channel layer, and having a carrier density below $1 \times 10^{15}$ cm$^{-3}$;

a source electrode region and a drain electrode region, the source and drain electrode regions being adapted to provide ohmic contact between the cap layer and source and drain electrodes when formed on the cap layer; and a gate electrode region, the gate electrode region adapted to provide Schottky contact between the cap layer and a gate electrode formed on the cap layer.

27. A field effect transistor according to claim 26, wherein dopant ions of the same conductivity type as the channel layer are implanted to form the source and drain electrode regions.

28. A field effect transistor according to claim 26, wherein the buffer layer, the channel layer and the cap layer are epitaxially grown layers.

29. A field effect transistor according to claim 26, wherein a carrier density of the doped layer is substantially equal to that of the channel layer.

30. A field effect transistor according to claim 26, wherein the un-doped buffer layer has a conductivity type opposite to that of the channel layer, and has a carrier density lower than that of the channel layer.

31. A field effect transistor according to claim 26, wherein a gap between the gate electrode region and the drain electrode region is wider than a gap between the gate electrode region and the source electrode region.

32. A field effect transistor according to claim 26, wherein the second compound semiconductor is GaAs.

* * * * *